United States Patent
Micheloni et al.

(10) Patent No.: US 6,728,141 B2
(45) Date of Patent: Apr. 27, 2004

(54) METHOD AND CIRCUIT FOR TIMING DYNAMIC READING OF A MEMORY CELL WITH CONTROL OF THE INTEGRATION TIME

(75) Inventors: Rino Micheloni, Turate (IT); Giovanni Campardo, Bergamo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/123,874

(22) Filed: Apr. 16, 2002

(65) Prior Publication Data

US 2002/0181277 A1 Dec. 5, 2002

(30) Foreign Application Priority Data

Apr. 19, 2001 (EP) .............................................. 01830266

(51) Int. Cl.$^7$ ................................................. G11C 7/00
(52) U.S. Cl. ........................... 365/189.01; 365/189.07; 365/189.09; 365/226
(58) Field of Search ...................... 365/189.01, 189.07, 365/189.09, 226

(56) References Cited

U.S. PATENT DOCUMENTS

| | | | |
|---|---|---|---|
| 5,748,534 A | 5/1998 | Dunlap et al. | 365/185.21 |
| 5,905,673 A * | 5/1999 | Khan | 365/185.03 |
| 5,909,393 A | 6/1999 | Tran et al. | 365/185.2 |
| 5,914,901 A | 6/1999 | Pascucci | 365/191 |
| 5,999,454 A | 12/1999 | Smith | 365/185.21 |
| 6,009,040 A | 12/1999 | Choi et al. | 365/233 |
| 6,034,888 A | 3/2000 | Pasotti et al. | 365/185.03 |
| 6,134,147 A | 10/2000 | Kaneda | 365/185.25 |
| 6,188,615 B1 | 2/2001 | Perner et al. | 365/189.01 |
| 6,337,808 B1 | 1/2002 | Forbes | 365/185.21 |
| 6,480,421 B2 | 11/2002 | Osama et al. | 365/185.21 |
| 2002/0057604 A1 * | 5/2002 | Khouri et al. | 365/200 |
| 2002/0149964 A1 * | 10/2002 | Campardo et al. | 365/185.03 |
| 2002/0149965 A1 * | 10/2002 | Campardo et al. | 365/185.03 |
| 2002/0192892 A1 * | 12/2002 | Micheloni et al. | 438/200 |

FOREIGN PATENT DOCUMENTS

EP 0 833 340 A1 4/1998

* cited by examiner

Primary Examiner—Viet Q. Nguyen
(74) Attorney, Agent, or Firm—Lisa K. Jorgenson; Robert Iannucci; Seed IP Law Group PLLC

(57) ABSTRACT

The method for timing reading of a memory cell envisages supplying the memory cell (with a constant current by means of a first capacitive element, integrating said current in a time interval, and controlling the duration of the time interval in such a way as to compensate for any deviations in the current from a nominal value. In particular, a reference current is supplied to a reference cell by means of a second capacitive element; next, a first voltage present on the second capacitive element is measured; finally, the memory cell is deactivated when the first voltage is equal to a second voltage, which is constant.

18 Claims, 6 Drawing Sheets

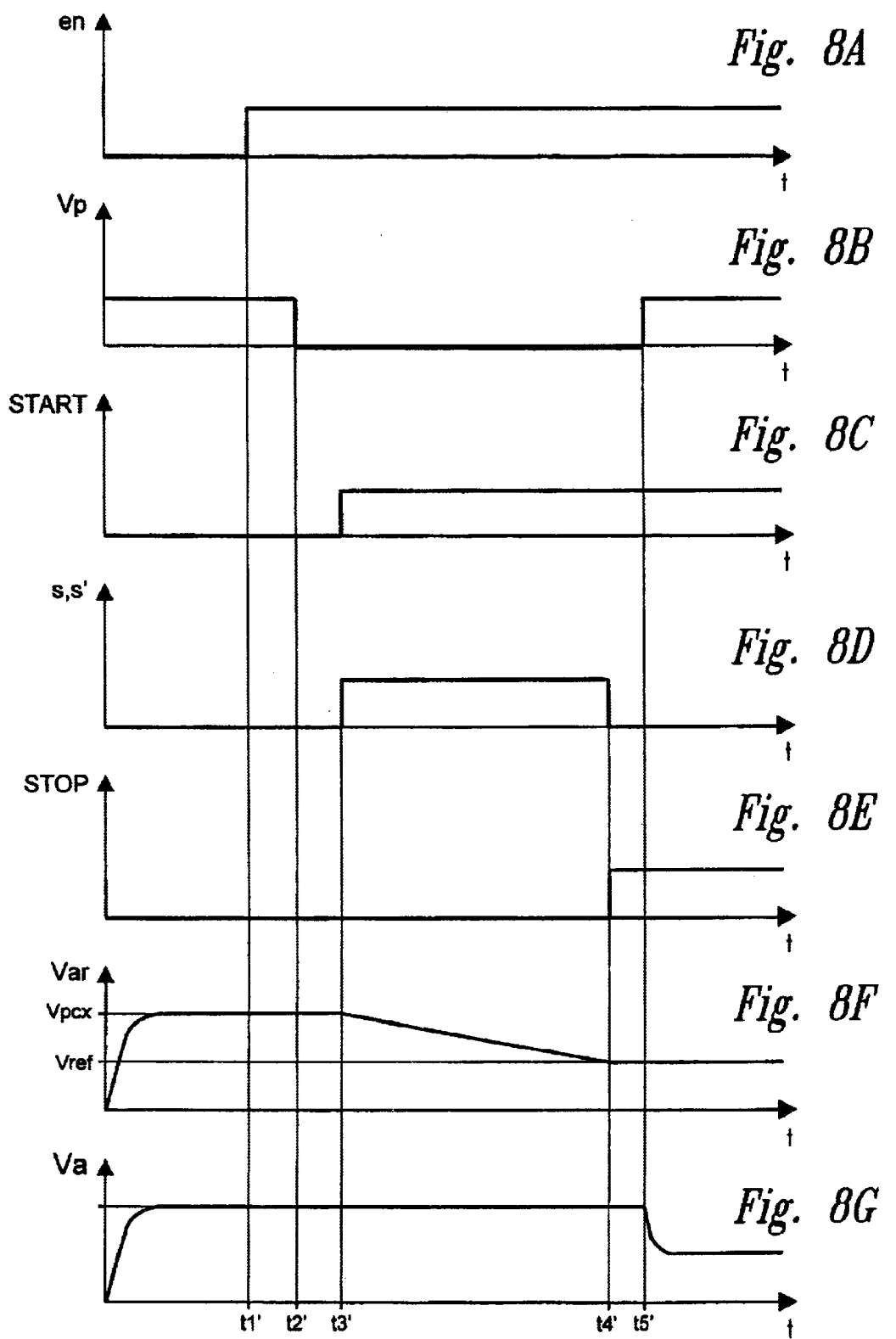

METHOD AND CIRCUIT FOR TIMING DYNAMIC READING OF A MEMORY CELL WITH CONTROL OF THE INTEGRATION TIME

BACKGROUND OF THE INVENTION

1. Field of the Invention

The present invention relates to a method and a circuit for timing dynamic reading of a memory cell with control of the integration time.

2. Description of the Related Art

As is known, the need for nonvolatile memories having increasingly larger densities has led to manufacturing multi-level memories wherein the information, stored as charge quantity in a floating-gate region, is encoded by fractioning the entrapped charge. In this way, the characteristic of a multilevel flash cell is described by a number of curves representing the pattern of the drain current Ids as a function of the gate voltage Vgs, each curve being associated to a different logic value. For examples FIG. 1 shows the characteristic of a four-level (2-bit) flash cell which stores the bits "11", "10","01", and "00", corresponding to threshold voltages Vt1, Vt2, Vt3 and Vt4.

Reading of multi-level cells is carried out evaluating the current or the voltage.

Current reading is based on comparing the current flowing in a cell at a preset gate voltage Vgs and the current flowing in a reference cell, the characteristic of which is intermediate between the distributions of the programmed cells, as shown in FIG. 2. The comparison is made after a current-to-voltage conversion, both of the current of the cell and of the reference current.

Current reading has a number of problems, the main ones depend on parasitic resistances, such as source and drain-contact resistance of the cell, resistance of the metal connections, and resistance caused by the pass transistors of the column decoder.

As a whole, the result is a reduction in current dynamics. Consequently, the comparator that compares the voltages after current-to-voltage conversion must have a greater sensitivity. In addition, the actual characteristics differ with respect to the ideal ones, as shown in FIG. 3. Due to such non-idealities, current reading of multilevel memory cells having more than two bits per cell is difficult, because it is required to distinguish extremely close current levels from one another.

To overcome the above problems, U.S. Pat. No. 6,034,888, in the name of the present Applicant, proposes a voltage reading method using a closed-loop circuit (see FIG. 4). In this circuit, the current of the cell to be read is compared with a reference current, and the gate voltage of the cell is modulated until reaching the equilibrium of the system. Thereby, the gate voltage of the cell reaches a value that can be defined as the threshold value of the cell.

However, also this solution is not free from problems, due to the need for an A/D converter able to read the voltage on the gate terminal of the cell, and to the constraint of not being able to read more than one cell at a time, since the row is in common to more than one cell and cannot assume different voltage values.

The solutions devised for solving the above problems moreover involve other disadvantages (increase in read time, greater area) and in any case call for the capacity to discriminate very small currents. On the other hand, the new technologies, involving a reduction in the cell dimensions, lead in turn to a reduction in the cell current, even though solutions are known for reducing the parasitic effects that determine the losses of linearity.

More recently, a dynamic reading of memory cells has been proposed, as described in European Patent Application N. 01830017.8 of Jan. 15, 2001, in the name of the present Applicant. Such proposal, which is based on time integration of the electric charge supplied to a memory cell to be read through a charging step or a discharging step of a capacitive element, will be hereinafter discussed, with reference to FIGS. 5 and 6.

In FIG. 5, a memory cell is represented by a current source 10, which is connected between a ground line or connection—hereinafter referred to as ground line 19—and a charge-transfer node 11. The current source 10 has a control node 10a receiving a first control signal s and absorbs a constant current I directed towards the ground line 19, when enabled by the first control signal s. The charge-transfer node 11 is connected to a reading circuit 20 comprising a decoupling stage 21, a charge-regeneration capacitor 22 having a capacitance Ca, and an integration capacitor 23 having a capacitance Cb.

In detail, the decoupling stage 21, formed by a circuit known as "cascode", comprises an inverting element, here an inverter 24, having an input connected to the charge-transfer node 11 and an output connected to the gate terminal of a cascode transistor 25, of NMOS type. The cascode transistor 25 moreover has a source terminal connected to the charge-transfer node 11 and a drain terminal connected to the drain terminal of a pass transistor 27, of NMOS type. The pass transistor 27 has a gate terminal receiving a second control signal Vp and a drain terminal connected to a charge-integration node 28.

The charge-regeneration capacitor 22 has a first terminal 22a connected to the charge-integration node 28 and a second terminal 22b connected to the ground line 19. The charge-integration node 28 is connected to the drain terminal of a charge transistor 29, of PMOS type. The charge transistor 29 has a source terminal connected to a biasing line 30 set at a bias voltage Vpcx and a gate terminal receiving a charge-enabling signal en. The bias voltage Vpcx can be either a standard supply voltage (e.g. of 3 V) or a boosted voltage (e.g,. of 6 V) provided by a boosting device of a known type and not shown herein.

Finally, the charge-integration node 28 forms the output of the reading circuit 20, and generates a voltage Va proportional, as will be explained hereinafter, to the current I flowing in the current source 10. A voltage Vb is present on the charge-transfer node 11.

Operation of the circuit of FIG. 5 is the following (see also FIGS. 6A–E).

Initially, the voltages Va and Vb on the charge-integration node 28 and on the charge-transfer node 11 are low. The first control signal s keeps the current source 10 off. In addition, the charge-enabling signal en is low and keeps the charge transistor 29 on. The second control signal Vp is high and keeps the pass transistor 27 on. In this condition, the output of the inverter 24 is high, and the cascode transistor 25 is on and enables charging of the integration capacitor 23 up to the threshold voltage of the inverter 24. As soon as the voltage Vb on the charge-transfer node 11 has reached the triggering voltage of the inverter 24, the latter switches and turns off the cascode transistor 25, which interrupts charging of the integration capacitor 23. In addition, the charge-regeneration capacitor 22 charges up to the bias voltage (i.e., until Va=Vpcx).

In steady-state conditions, at the end of charging, the following relations apply:

$$V_{ai} = Vpcx$$

$$Q_{ai} = C_a V_{ai} = C_a Vpcx$$

$$Q_{bi} = C_b V_{bi}$$

where $V_{ai}$ is the value of the voltage $V_a$ at the end of the charging step, $Q_{ai}$ is the charge stored in the charge-regeneration capacitor 22, $V_{bi}$ is the value of the voltage $V_b$ at the end of the charging step, and $Q_{bi}$ is the charge stored in the integration capacitor 23.

At the instant t1, the charge-enabling signal en switches to the high state (Vpcx) and turns off the charge transistor 29 (in this way isolating the charge-regeneration capacitor 22 from the supply line 30). Next (instant t2), the second control signal Vp switches to low and turns off the pass transistor 27 (thereby isolating the charge-transfer node 11 and the charge-integration node 28). Finally (instant t3), the first control signal s switches and turns on the current source 10, which, to a first approximation, goes to a steady-state condition in a negligibly small time, so that the integration capacitor 23 will not be affected by current transients.

Consequently, the integration capacitor 23 discharges linearly, supplying the constant current I to the current source 10 through the charge-transfer node 11. At the instant t4, the control signal s switches again and turns off the current source 10, thus interrupting the discharging step. In practice, if $\Delta t = t4-t3$ is the time interval when the current source 10 is on, $\Delta Vb$ is the voltage variation on the charge-transfer node 11 for the time interval $\Delta t$, and $\Delta Qb$ is the charge supplied to the current source 10, i.e., the charge lost by the integration capacitor 23, we have $$V_{a,t3} = Vpcx$$

$$I = C_b \frac{\Delta V_b}{\Delta t}$$

$$I \Delta t = C_b \Delta V_b = \Delta Q_b$$

$$\Delta V_b = \frac{I \Delta t}{C_b} = \frac{\Delta Q_b}{C_b}$$

For example, with $C_a = 0.5$ pF and $C_b = 5$ pF, the time interval $\Delta t$ when discharging of the integration capacitor 23 takes place is about 60 nsec.

Next (instant t5), the second control signal Vp switches again to high, turning on the pass transistor 27 and connecting together, through the decoupling stage 21, the charge-integration node 28 and the charge-transfer node 11. Consequently, the charge-regeneration capacitor 22 discharges rapidly to the integration capacitor 23, re-integrating the charge lost by the latter, according to a charge-sharing process. In practice, the charge-regeneration capacitor 22 operates as a charge reservoir. However, the charge-integration node 28 and the charge-transfer node 11 do not assume the same potential. In fact, the decoupling stage 21 allows the charge-transfer node 11 to reach only the value of the triggering voltage of the inverter 24, after which the inverter 24 turns on the cascode transistor 25, thus once again isolating the charge-integration node 28 from the charge-transfer node 11. The charge-integration node 28, instead, goes to a voltage value $V_{af}$ given by the capacitive sharing between the integration capacitor 23 and the charge-regeneration capacitor 22 (charge-sharing step).

At the end, in steady-state conditions, the final voltage on the charge-regeneration capacitor 22 is equal to $V_{af}$, the final charge of the charge-regeneration capacitor 22 is equal to $Q_{af}$, and the charge transferred from the charge-regeneration capacitor 22 to the integration capacitor 23 is $\Delta Q_a$, equal to the charge $\Delta Qb$ lost by the charge-regeneration capacitor (which has returned to the initial conditions). Consequently, we have $$V_{bf} = V_{bi}$$

$$V_{a,f} = \frac{Q_{af}}{C_a} = \frac{Q_{ai} - \Delta Q_a}{C_a} = \frac{Q_{ai} - \Delta Q_b}{C_a} = \frac{C_a V_{ai} - I\Delta t}{C_a} = \frac{C_a Vpcx - I\Delta t}{C_a}$$

and hence $$V_{a,f} = V_{pcx} - \frac{I \Delta t}{C_a} \quad (1)$$

In practice, there exists a linear relation between the final voltage Va on the charge-integration node 28 and the current absorbed by the current source 10. Consequently, integrating the current absorbed by the current source 10 in a preset time interval (integration time $\Delta t$), the voltage Va on the charge-integration node 28 is proportional to the current I. Consequently, by appropriately sizing the integration time $\Delta t$ and the capacitance Ca, the value of the current I, even if very small, can be converted into a voltage value (voltage Va) having an amplitude that may be read with present-day current circuits.

In addition, from Equation (1) it is possible to calculate the variation $\Delta Va$ of the voltage Va on the charge-integration node 28 generated by variations $\Delta I$ of the current of the current source 10. In fact, from Equation (1) it is $$\frac{\Delta V_a}{\Delta I} = -\frac{\Delta t}{C_a} \quad (2)$$

Relation (2) makes it possible to distinguish very small current variations from one another by measuring the voltage difference $\Delta Va$ that may be obtained on the charge-integration node 28.

For example, setting $\Delta t = 50$ ns, if a variation $\Delta Va$ of 100 mV is desired for a current variation $\Delta I = 1$ $\mu A$, we obtain $$C_a = \frac{\Delta I}{\Delta V_{af}} \Delta t = 0.5 pF$$

If it is desired a reduction of the voltage Vb on the charge-transfer node 11 of 0.5 V in 50 ns for a maximum current of 50 $\mu A$ (which is assumed as being the maximum of the dynamics for the memory cell represented schematically by the current source 10), we have $$C_b = \frac{I \Delta t}{\Delta V_b} = 5 pF$$

With this sizing we then obtain that, for each $\mu A$ of variation in the current I of the current source 10, the voltage Va on the charge-integration node 28 varies by 100 mV, which can be detected without any problems.

In the European patent application referred to above it is moreover demonstrated that the source 10 is equivalent to a nonvolatile memory cell which may be connected to and disconnected from the charge-transfer node 11 through the column decoder (which receives the control signal s) and a further cascode circuit.

The read circuit described above thus enables discrimination, in a short time, of programming states that are very close to one another, in practice enabling increase in the number of bits that may be stored in a cell (for example, four bits, corresponding to 16 programming levels), but has a number of drawbacks. It is known, in fact, that, given the same programming level, the current flowing in a nonvolatile memory cell depends upon a plurality of factors, both external factors (e.g., temperature) and process factors. Consequently, also the charge ΔQb supplied by the integration capacitor 23 to the current generator 10 and the voltage Va on the charge-regeneration node 28 at the end of the charge-sharing step are not constant, but depend upon the external factors and process factors themselves by means of the current I, as shown by the above-mentioned relation ΔQb=IΔt as well as upon relation (1).

In practice, as the process conditions, the biasing voltage and the temperature vary, it is not possible to guarantee that the result of the charge-regeneration step will be constant, or, in other words, that the charge ΔQb lost by the integration capacitor 23 at the end of the interval Δt, and hence the voltage Va on the charge-integration node 28, will remain constant whenever a cell having a given programming level is read.

On the other hand, possible variations in the voltage Va deriving therefrom may cause reading errors. For example, if the current carried by the cells increases, the charge ΔQb lost by the integration capacitor 23 may happen to be greater than the charge that is altogether present on the restore capacitor or charge-regeneration capacitor 22. In this case, the charge-regeneration capacitor 22 discharges completely without being able to replace altogether the charge ΔQb lost by the integration capacitor 23, and hence certain programming levels (in particular those to which there correspond lower threshold voltages and higher cell currents) may become indistinguishable from one another.

BRIEF SUMMARY OF THE INVENTION

An embodiment of the present invention provides a read-timing circuit that will enable the limitations described above to be overcome.

In an embodiment of the present invention, a method and a circuit for timing dynamic reading of a memory cell are provided wherein the device has a first capacitive element connected to a memory cell and supplies a first constant current when the memory cell is activated and activation and control elements for activating the memory cell for a controlled time interval such as to compensate for deviations of a first current from a nominal value.

BRIEF DESCRIPTION OF THE SEVERAL VIEWS OF THE DRAWING(S)

For a better understanding of the present invention, preferred embodiments thereof are now described, purely to provide non-limiting examples, with reference to the attached drawings, in which.

Figure 1:
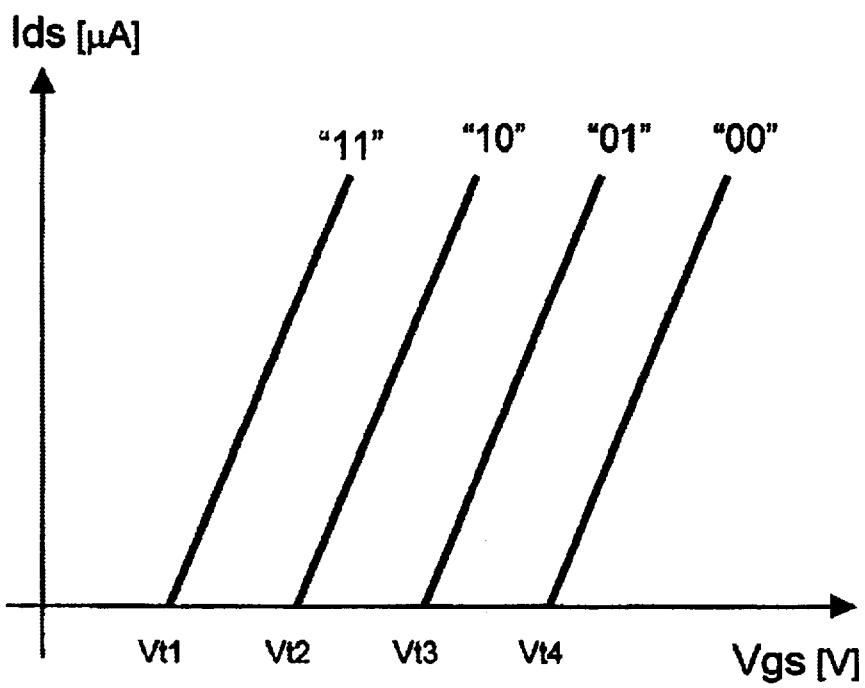
FIG. 1 shows the current-voltage characteristics of a two-bit flash memory cell.
Figure 2:
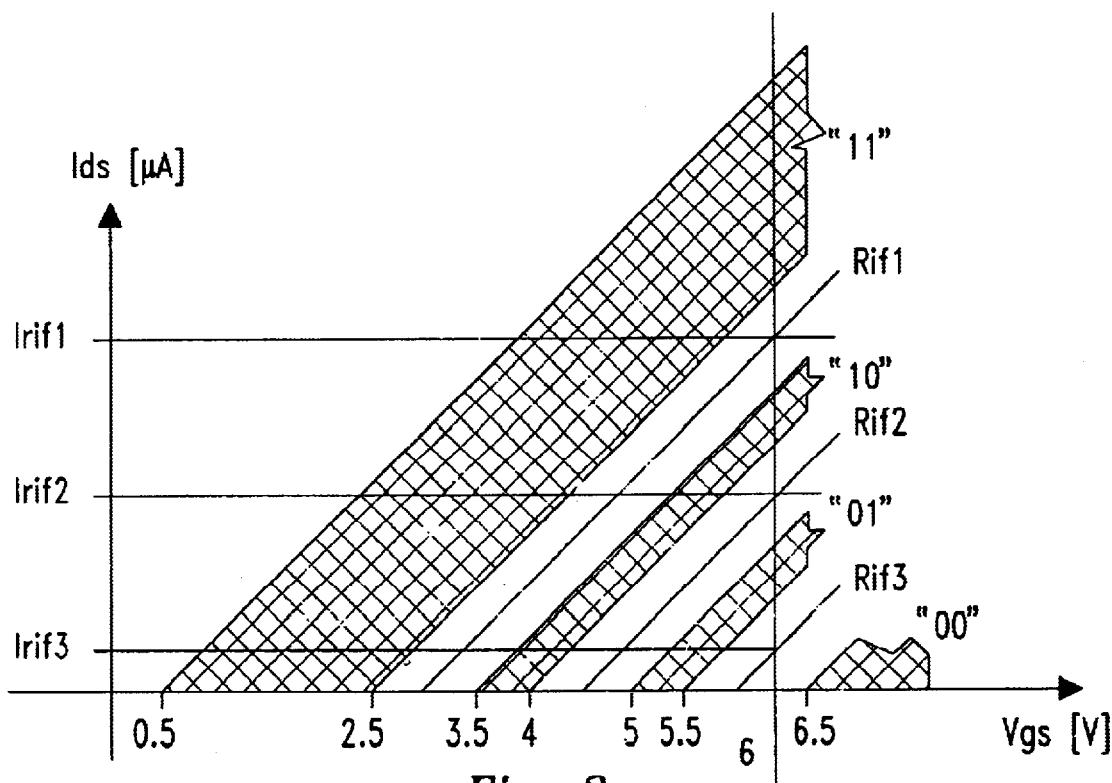
FIG. 2 shows the distribution of the characteristics of two-bit flash memory cells and of reference cells, in the case of reading in current.
Figure 3:
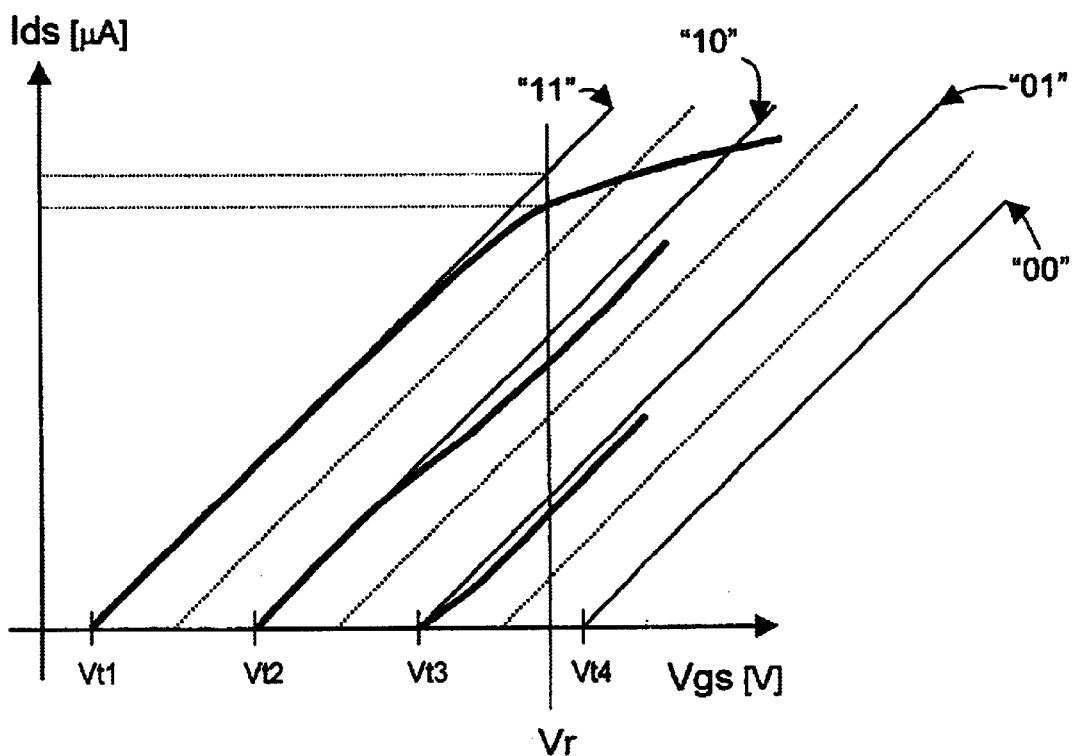
Figure 4:
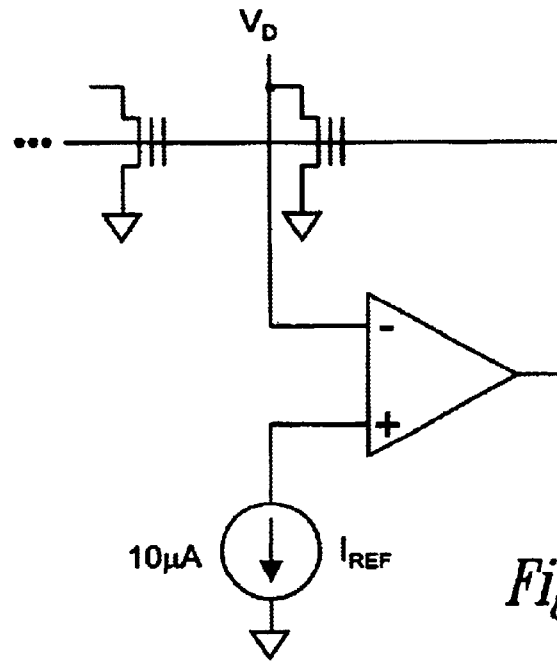
Figure 5:
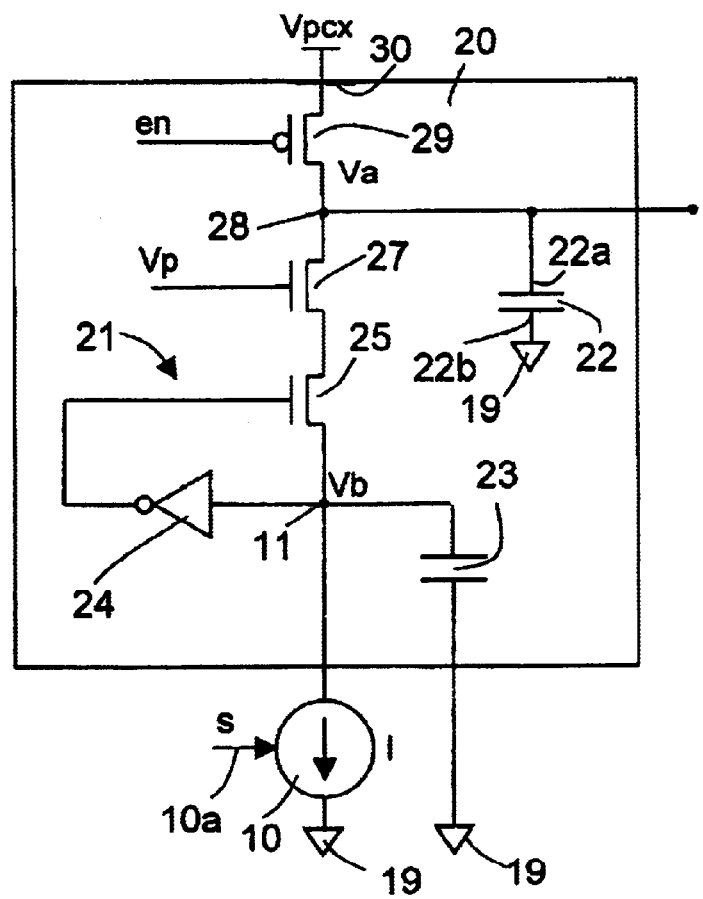
Figure 6:
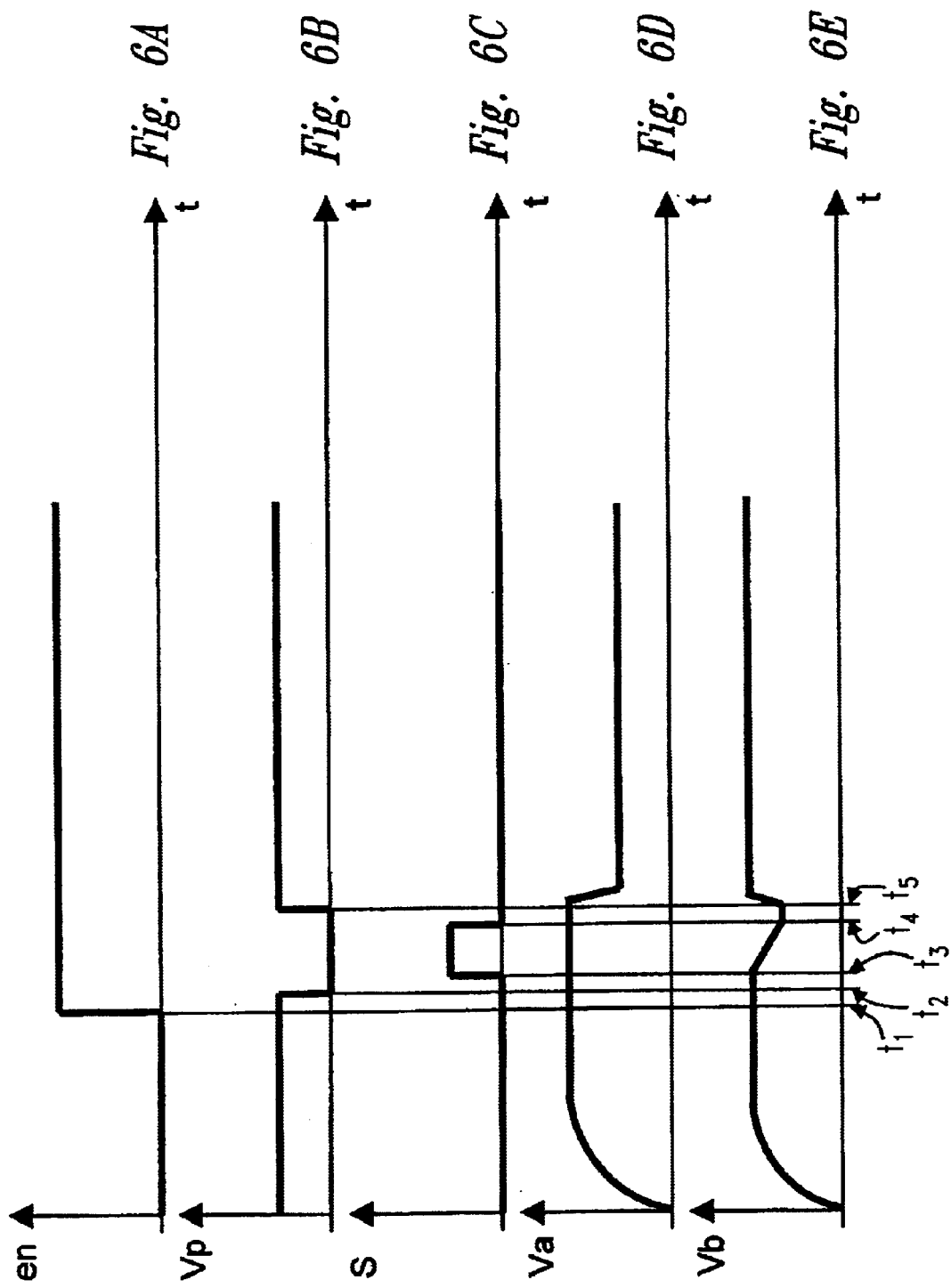
Figure 7:
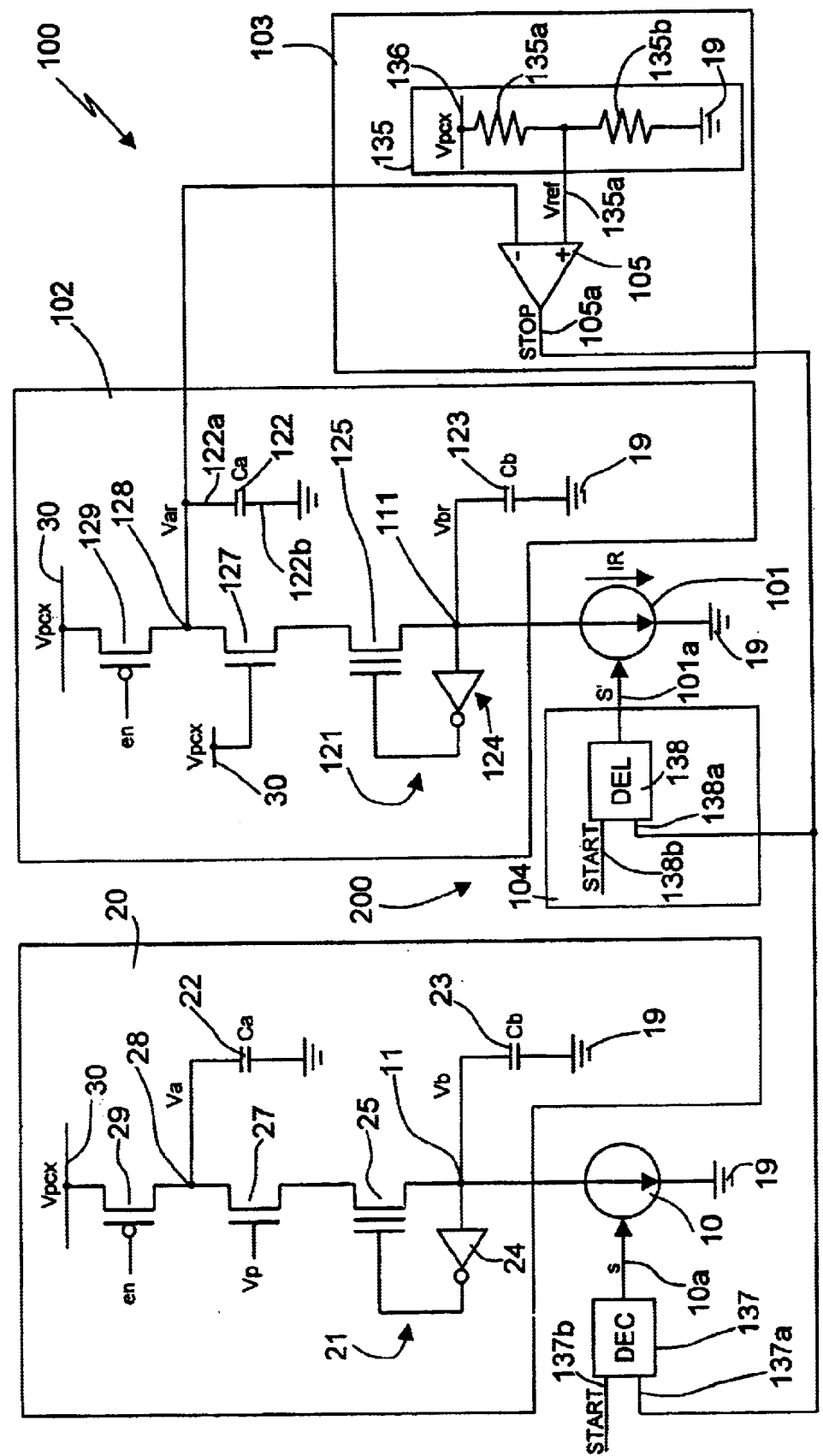

FIG. 3 presents the modification of the ideal characteristics of FIG. 1 in the presence of parasitic effects;

FIG. 4 shows a known voltage-reading circuit;

FIG. 5 shows a simplified electrical diagram of a read circuit forming the subject of a previous patent application;

FIGS. 6A–E show timing diagrams of the circuit of FIG. 5;

FIG. 7 presents a simplified electrical diagram of a memory device including the timing circuit according to the invention; and FIGS. 8A–G show timing diagrams of the device of FIG. 7.

DETAILED DESCRIPTION OF THE INVENTION

With reference to FIG. 7, in which parts that are identical to those already shown are designated by the same reference numbers, a memory device 100 comprises the read circuit 20 of FIG. 5, which will not be further described herein, a row decoder 137, and a read-timing circuit 200. The read-timing circuit 200 comprises a reference current generator 101 of a controlled type, a reference circuit 102 similar to the read circuit 20, a comparator circuit 103, and a delay-compensation circuit 104.

In detail, the reference current generator 101 is connected between the ground line 19 and a reference charge-transfer node 111 of the reference circuit 102, and has a control terminal 101a that receives a third control signal s' equal to the first control signal s. In practice, represented schematically by means of the reference current generator 101 is a reference cell, which has a pre-set programming level, and hence which is traversed by a reference current $I_R$.

The reference circuit 102 has a structure similar to that of the read circuit 20 and comprises a reference decoupling stage 121, a reference charge-regeneration capacitor 122 having a capacitance Ca, and a reference integration capacitor 123 having a capacitance Cb. The reference decoupling stage 121 is a "cascode" stage and comprises an inverting element, here an inverter 124, having an input connected to the reference charge-transfer node 111 and an output connected to the gate terminal of a cascode transistor 125, of NMOS type. The cascode transistor 125 moreover has a source terminal connected to the reference charge-transfer node 111 and a drain terminal connected to the drain terminal of a reference pass transistor 127, of NMOS type. The reference pass transistor 127 has a gate terminal connected to the biasing line 30 (it is therefore always on) and a drain terminal connected to a reference charge-integration node 128.

The reference charge-regeneration capacitor 122 has a first terminal 122a connected to the reference charge-integration node 128 and a second terminal 122b connected to the ground line 19. The reference charge-integration node 128 is connected to the drain terminal of a charge transistor 129, of PMOS type. The charge transistor 129 has a source terminal connected to the biasing line 30 and a gate terminal receiving the charge-enabling signal en.

On the reference charge-integration node 128 and on the reference charge-transfer node 111 of the reference circuit 102 there are respectively a voltage Var, which is proportional to the reference current $I_R$ flowing in the reference current generator 101, and a voltage Vbr.

The comparator circuit 103 comprises a comparator 105 and a voltage-generator circuit 135. The comparator 105 has a first input connected to the reference charge-integration node 128, and a second input connected to an output 135a of the voltage-generator circuit 135, on which there is a reference voltage Vref. Preferably, the voltage-generator circuit 135 comprises a resistive divider made up of a pair of resistors 135b, 135c which are connected in series between the ground line 19 and the biasing line 30 and which form an intermediate tap connected to the output 135a of the voltage-generator circuit 135. Consequently, the reference voltage Vref is equal to a pre-set fraction of the biasing voltage Vpcx.

The comparator 105 moreover comprises an output 105a, which supplies a stop signal STOP and is connected to respective first inputs 137a and 138a of the row decoder 137 and of a delay circuit 138 belonging to the delay-compensation circuit 104. The row decoder 137 and the delay decoder 138 moreover have respective second inputs 137b, 138b which receive an activation signal START. In addition, the column decoder 137 (made in a known way and not described in detail herein) has an output which is connected to the control terminal 10a of the current generator 10 and supplies the first control signal s, while the delay circuit 138 has an output which is connected to the control terminal 101a of the reference current generator 101 and supplies the third control signal s'. In particular, the presence of the delay circuit 138 (made, in the simplest case, of a set-reset flip-flop or reproducing the structure of the row decoder 137, so as to have the same delay times) makes it possible to render uniform the times of propagation of the signals towards the current generator 10 and the reference current generator 101.

The activation signal START and stop signal STOP bring about switching of the first control signal s and third control signal s'. In particular, the control signals s, s', which are normally low, are set at the high state when the row decoder 137 and the delay circuit 138 are enabled by the activation signal START; subsequently, they go back to the low state when the stop signal STOP switches, thus disabling the row decoder 137 and the delay circuit 138.

Operation of the memory device 100 is illustrated in what follows, also with reference to the timing of FIGS. 8A–G.

Initially, a charging step is performed by setting the charge-enable signal en at the low level and keeping the second control signal Vp high. In this way, the charge-enable transistors 29, 129 and the pass transistor 27 of the read circuit 20 conduct (the reference pass transistor 127 is always on). Consequently, the charge-integration nodes 28, 128 go to the biasing voltage Vpcx, while the charge-transfer nodes 11, 111 reach the triggering voltage of the inverters 24, 124, as was explained previously with reference to FIG. 5.

At the instant t1', the charge-enabling signal en switches to the high state, turning off the charge-enable transistors 29, 129, and the charging step terminates.

Subsequently, a charge-integration step having a controlled duration is carried out. In detail, at the instant t2', the second control signal Vp switches to the low state, turning off the pass transistor 27 of the read circuit 20. Next, at the instant t3', the activation signal START is set at the high state, thus enabling the row decoder 137 and the delay circuit 138, and the first control signal s and third control signal s' go to the high state. Consequently, the current generators 10, 101 are on and conduct respective currents I, $I_R$.

As already explained, in this phase the integration capacitor 23 of the read circuit 20 discharges, and the voltage Vb on the charge-transfer node 11 decreases, while the voltage Va on the charge-integration node 28 of the read circuit 20 remains constant, in practice preventing discharging of reference integration capacitor 123.

On the other hand, given that the reference pass transistor 127 remains on, the reference current $I_R$ flowing in the reference current generator 101 is in practice supplied by the reference charge-regeneration capacitor 122. Consequently, the voltage Var present on the reference charge-integration node 128 decreases linearly (FIGS. 8A–G), and the voltage Vrb on the reference charge-transfer node 111 remains roughly equal to the triggering voltage of the inverter 124. Consequently, in this step the reference integration capacitor 123 has no effect.

When the voltage Var on the reference charge-integration node 128 reaches the reference voltage Vref (instant t4'), the comparator 105 switches, sending the stop signal STOP to the high state. Consequently, the row decoder 137 and the delay circuit 138 are disabled, and the control signals s, s' return to the low state. The current generators 10, 101 are therefore turned off, and the integration step terminates.

Subsequently, the charge accumulated on the charge-regeneration capacitor 22 of the read circuit 20 is shared to restore the charge released by the integration capacitor 23 during the integration step, as already explained with reference to FIG. 5. In particular (instant t5'), the second control signal Vp switches to the high state again, turning on the pass transistor 27 and connecting together, through the decoupling stage 21, the charge-integration node 28 and the charge-transfer node 11. Consequently, the charge-regeneration capacitor 22 discharges rapidly towards the integration capacitor 23, re-integrating the charge lost by the latter according to a charge-sharing process. When the voltage Vb on the charge-transfer node of the read circuit 20 reaches the triggering voltage of the inverter 24, the latter turns off the cascode transistor 25, isolating again the charge-integration node 28 from the charge-transfer node 11, and the charge-sharing process is automatically interrupted.

In practice, according an embodiment of the invention, the duration of the time interval Δt, in which integration is performed, is controlled in such a way as to compensate for possible variations in the currents flowing in the cells with respect to nominal values and to maintain the charge ΔQb lost by the integration capacitor 23 substantially constant, given the same level of programming of the cells themselves. Consequently, also the charge released by the charge-regeneration capacitor 22 and the voltage Va on the charge-integration node 28 of the read circuit 20 at the end of the charge-sharing step are not affected by the variations in the current flowing in the cells.

Control of the time interval Δt is obtained by allowing the reference charge-regeneration capacitor 122 to discharge at a constant current and interrupting the integration step when the voltage Var on the reference charge-integration node 128 is equal to the reference voltage Vref, i.e., when the following condition is met:

$$Var = Vref = Vpcx - \frac{\Delta Qr}{Ca} = Vdd - \frac{I_R \Delta t}{Ca} \qquad (3)$$

In particular, when the reference current $I_R$ decreases, the duration of the time interval Δt increases; vice versa, when the reference current $I_R$ increases, the duration of the time interval Δt decreases.

Since the variations in the temperature and in the process parameters generally affect the entire memory device 100 uniformly, the current I conducted by the memory cell that is read has variations substantially equal to the variations in the reference current $I_R$. Consequently, possible increases and decreases of the current I of the cell with respect to a nominal value, which is indicative of the programming level of the cell itself, are respectively compensated for by decreases and, respectively, increases in the duration of the integration step.

In addition, whenever a cell having a given programming level is read, the voltage Va present on the charge-integration node 28 at the end of the charge-sharing step keeps roughly equal to a pre-set fraction of the biasing voltage Vpcx. In fact, in accordance with what has been explained above, the voltage Va on the charge-integration node 28 at the end of the charge-sharing step is correlated also to the final value of the voltage Var on the reference charge-integration node 128, i.e., to the value of the reference voltage Vref. In particular, an increase in the reference voltage Vref causes a reduction in the duration of the integration step, and hence an increase in the voltage Va on the charge-integration node 28; vice versa, following upon a decrease in the reference voltage Vref, the duration of the integration step increases, and the voltage Va on the charge-integration node 28 decreases.

On the other hand, the reference voltage Vref varies as the biasing voltage Vpcx varies, given that it is generated by means of a resistive division of the biasing voltage Vpcx, but the ratio Vpcx/Vref remains constant. Consequently, also the ratio Va/Vpcx remains substantially unvaried (clearly, a specific value of the voltage Va, and hence of the ratio Va/Vpcx corresponds to each programming level of the memory cells).

From what has been illustrated, it is clear that the invention advantageously makes it possible to obtain, first of all, an accurate control of the charge released by the integration capacitor 23 of the read circuit 20 during the integration step. Consequently, the voltage reached by the charge-integration node 28 at the end of the charge-sharing step is substantially independent of the types of disturbance described (in particular of the variations in temperature), and hence reading of the memory cells is precise and less subject to errors than in circuits according to the prior art.

In the second place, by controlling the duration of the integration step (i.e., of the time interval Δt) it is possible to keep substantially unvaried the ratio Va/Vpcx, i.e., the ratio between the voltage Va on the charge-integration node 28 and the biasing voltage Vpcx. In this way, it is possible to exploit all the dynamics allowed even in the presence of values of the biasing voltage Vpcx that are very different from one another, and it is possible to prevent voltages Va generated by reading of cells having distinct programming levels from being rendered indistinguishable from one another. In particular, it is possible to prevent the charge-regeneration capacitor 22 from releasing the entire charge available without being able to restore completely the charge ΔQb lost by the integration capacitor 23.

In addition, control of the duration of the time interval Δt is carried out starting from the discharging voltage of the reference charge-regeneration capacitor 122. The said voltage decreases linearly and in relatively short time intervals, and thus enables the moment in which the pre-set amount of reference charge ΔQr has been transferred to be determined with a good degree of precision. Instead, direct control of the voltage Va, given the high rapidity of the charge-sharing step, which has a duration several orders of magnitude shorter than that of the charge-integration step, would not enable an equally high degree of accuracy.

Control of the duration of the time interval Δt generally operates properly, irrespective of the charge stored in the reference cell chosen. However, in certain cases it is possible to have a number of reference cells storing different threshold voltage values (and hence cells traversed by different currents $I_R$), for example cells set at the opposite ends of the values, and it is possible to choose each time, according to the existing conditions, the best reference cell, i.e., the one that enables a more precise control and that is able to afford a better average precision with respect to all the reference cells.

Finally, it is clear that numerous modifications and variations may be made to the read-timing method and circuit described and illustrated herein, all falling within the scope of the inventive idea, as defined in the attached claims. In particular, the method described can be used for reading memory cells of different types, whether volatile or non-volatile.

In addition, the charge-sharing process that follows the integration step can be implemented differently from what has been described. For example, the read circuit 20 may comprise a plurality of charge-regeneration capacitors 22, which are charged at the biasing voltage Vpcx and are then connected alternately and in succession to the charge-integration node 28.

It is also possible to carry out the charge-sharing process simultaneously with the control of the time interval Δt, keeping the pass transistor 27 of the read circuit 20 turned on while the current generator 10 conducts and absorbs the current I. In this case, also the charge-regeneration capacitor 22, which is connected to the charge-transfer node 11, discharges linearly, while the integration capacitor 23 has no effect.

The resistive divider 135 of the comparator circuit 103 can be connected between the ground line 19 and a regulated-voltage line which supplies a regulated voltage that is constant and substantially independent of variations in the temperature and in the process parameters. In this way, also the reference voltage Vref is a regulated voltage and is constant and independent of variations in the temperature and in the process parameters.

In addition, the decoupling circuits may be implemented also in a different way, typically by supplying the cascode transistors with pre-set biasing voltages which modulate the conductivity of said transistors also as a function the voltage Vb on their terminals which are connected to the memory cell (drain terminals), and hence eliminating the inverting elements. In some embodiments the pass transistors may be absent.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for timing reading of a memory cell, comprising the steps of:
   supplying a memory cell with a first constant current by means of a first capacitive element;
   integrating said first current in a time interval; and
   controlling the duration of said time interval in order to compensate for deviations of said current with respect to a nominal value.

2. The method according to claim 1, wherein said step of controlling the duration comprises:
   increasing the duration of said time interval when said current is smaller than said nominal value; and decreasing the duration of said time interval when said current is greater than said nominal value.

3. The method according to claim 1, wherein said step of controlling the duration comprises:

supplying a reference cell with a second constant current by means of a second capacitive element;

integrating said second constant current;

measuring a first voltage present on said second capacitive element; and interrupting said steps of integration of said first and second constant currents when said first voltage is equal to a second voltage which is constant.

4. The method according to claim 3, further comprising the step of providing a biasing line which supplies a biasing voltage, said second voltage being equal to a pre-set fraction of said biasing voltage.

5. The method according to claim 3, further comprising the step of providing a regulated voltage that is constant and independent of the temperature, said second voltage being equal to a pre-set fraction of said regulated voltage.

6. The method according to claim 5, wherein said step of supplying a reference current comprises activating said reference cell simultaneously with said memory cell.

7. The method according to claim 6, wherein said interruption step comprises:

generating a stop signal when said first voltage is equal to said second voltage; and supplying to a control terminal of said memory cell a control signal correlated to said stop signal.

8. The method according to claim 7, further comprising the steps of:

before carrying out said step of supplying said first constant current, charging said first capacitive element and at least one third capacitive element respectively to a first charge value and a second charge value; and after said integration step, sharing said second charge between said first capacitive element and said at least one third capacitive element.

9. A device for timing reading of a memory cell, comprising:

a first capacitive element connected to a memory cell and supplying a first constant current when said memory cell is activated;

an activation and control means for activating said memory cell for a controlled time interval such as to compensate for deviations of said first current from a nominal value.

10. The device according to claim 9, wherein said activation and control means comprise:

a reference cell;

a second capacitive element connected to said reference cell and supplying a constant reference current when said reference cell is activated; and a turning-on and turning-off means for activating said memory cell and deactivating said memory cell when a voltage present on said second capacitive element is equal to a reference voltage.

11. The device according to claim 10, wherein said turning-on and turning-off means comprise a comparator circuit generating a stop signal when said voltage present on said second capacitive element is equal to said reference voltage.

12. The device according to claim 11, wherein said comparator circuit comprises voltage-generating means having an output which supplies said reference voltage, and a comparator having a first input connected to said second capacitive element, a second input connected to said output of said voltage-generating means, and an output supplying said stop signal.

13. The device according to claim 12, wherein said voltage-generating means comprise voltage-dividing means connected between a ground line and a biasing line which supplies a biasing voltage; and said voltage-dividing means comprising an intermediate node which supplies said reference voltage.

14. The device according to claim 12, wherein said voltage-generating means comprise voltage-dividing means connected to a ground line and receiving a regulated voltage that is constant and independent of the temperature; and said voltage-dividing means comprising an intermediate node which supplies said reference voltage.

15. The device according to claim 14, wherein said activation and control means comprise row-decoding means having an input connected to said output of said comparator, and an output connected to a control terminal of said memory cell; said output of said row-decoding means supplying a first control signal correlated to said stop signal.

16. The device according to claim 15, wherein said activation and control means comprise a delay circuit having an input connected to said output of said comparator and an output connected to a control terminal of said reference cell; said output of said delay circuit supplying a delay command signal correlated to said stop signal.

17. The device according to claim 16, wherein it comprises at least one third capacitive element and connection means for connecting and disconnecting alternately said first capacitive element and said third capacitive element.

18. The device according to claim 17, wherein said connection means comprise a cascode stage.

* * * * *